United States Patent
Subramanian

[19]
[11] Patent Number: 5,965,284
[45] Date of Patent: Oct. 12, 1999

[54] MAGNETORESISTIVE SCANDIUM-SUBSTITUTED THALLIUM MANGANESE PYROCHLORE COMPOUNDS

[75] Inventor: Munirpallam Appadorai Subramanian, Kennett Square, Pa.

[73] Assignee: E. I. du Pont de Nemours and Company, Wilmington, Del.

[21] Appl. No.: 09/060,957

[22] Filed: Apr. 16, 1998

Related U.S. Application Data

[60] Provisional application No. 60/045,645, Apr. 18, 1997.
[51] Int. Cl.$^6$ ........................................................ G11B 5/66
[52] U.S. Cl. .............. 428/692; 428/694 R; 428/694 GT; 428/694 T; 428/694 XS; 428/900; 501/10; 501/126; 360/113; 324/252; 257/421
[58] Field of Search ................................. 428/692, 694 R, 428/694 GT, 694 XS, 694 T; 501/10, 126; 360/113; 324/252; 257/421

[56] References Cited

U.S. PATENT DOCUMENTS

| | | | |
|---|---|---|---|
| 5,767,673 | 6/1998 | Batlogg | 324/252 |
| 5,792,718 | 8/1998 | Shimakawa | 501/152 |

OTHER PUBLICATIONS

Greedan et al. "Structure and Magnetic Properties of the Pyrochlore Sc$_2$Mn$_2$O$_7$" Solid State Communications vol. 99, No. 6 pp. 399–404, 1996.
Cheong et al "Giant Magnetoresistance in Pyrochlore Tl$_{2-x}$In$_x$Mn$_2$O$_7$" Solid State Communications, vol. 98, No. 2 pp. 163–166, 1996.
Babich, M.N. et al., Giant Magnetoresistance of (001)Fe/(001) Cr Magnetic Superlattices, Phys. Rev. Lett., 61, 2472, 1988.
Jin, S. et al., Thousandfold Change in Resistivity in Magnetoresistive La–Ca–Mn–O Films, Science, 264, 413–415, 1994.
Shimakawa, Y. et al., Giant Magnetoresistance in Tl$_2$Mn$_2$O$_7$ with the Pyrochlore Structure, Nature, 379, 53–55, 1996.
Cheong, S–W. et al., Giant Magnetoresistance in Pyrochlore Tl$_{2-x}$In$_x$Mn$_2$O$_7$, Solid State Communications, 98, 163–166, 1996.
Greedan, J.E. et al., Structure and Magnetic Properties of the Pyrochlore Sc$_2$Mn$_2$O$_7$, Solid State Communications, 99, 399–402, 1996.
Moritomo, Y. et al., Giant Magnetoresistance of Manganese Oxides with a Layered Perovskite Structure, Nature, 380, 141–144, 1996.
Nickel, Janice, Magnetoresistance Overview, Hewlett Packard Company, 95–60, 1–11, 1995.
Subramanian, M.A. et al., Colossal Magnetoresistance Without Mn$^{3+}$/Mn$^{4+}$ Double Exchange in the Stoichiometric Pyrochlore Tl$_2$Mn$_2$O$_2$, Science, 273, 81–84, 1996.
Rao, C.N.R. et al., Giant Magnetoresistance in Transition Metal Oxides, Science, 272, 369–370, 1996.
Derbyshire, K. et al., Giant Magnetoresistance for Tomorrow's Hard Drives, Solid State Technology, 57–66, Sep. 1995.

Primary Examiner—Leszek Kiliman

[57] ABSTRACT

Scandium-substituted thallium manganese pyrochlore compounds having increased magnetoresistance compared to unsubstituted compounds are disclosed. Such compounds are suitable for use in magnetic read heads and provide the choice of resistivity range.

6 Claims, 2 Drawing Sheets

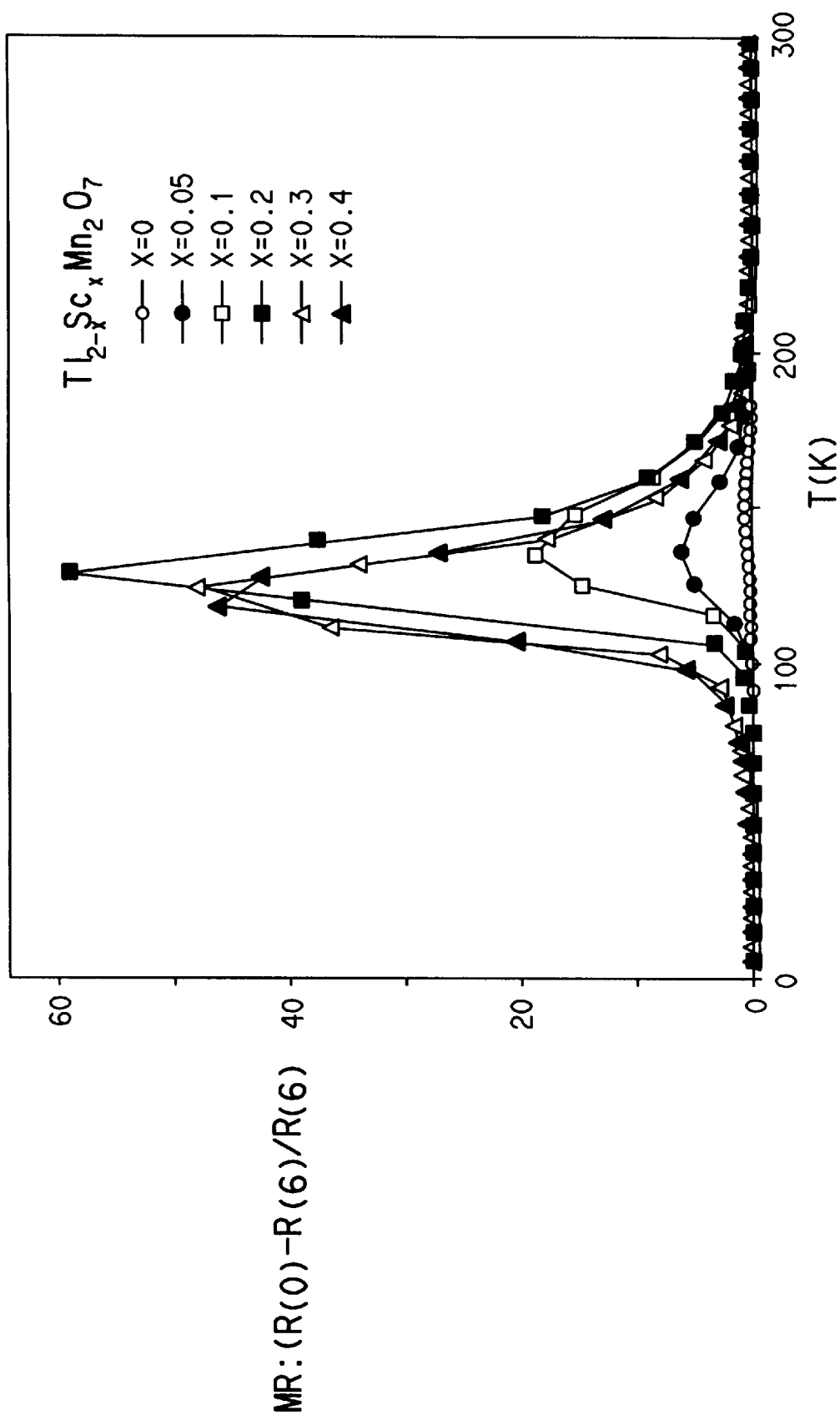

MAGNETORESISTIVE SCANDIUM-SUBSTITUTED THALLIUM MANGANESE PYROCHLORE COMPOUNDS

CROSS-REFERENCE TO RELATED APPLICATIONS

This application claims the priority benefit of U.S. Provisional Application 60/045,645, filed Apr. 18, 1997.

FIELD OF THE INVENTION

The invention generally relates to scandium-substituted thallium manganese pyrochlore compounds. In particular, the invention relates to scandium-substituted thallium manganese pyrochlore having increased magnetoresistance compared to unsubstituted compounds.

BACKGROUND OF THE INVENTION

Magnetoresistance (MR) is the change in the resistivity of a material as a result of the application of a magnetic field. Ordinary magnetoresistance of non-magnetic metals and anisotropic magnetoresistance (AMR) of ferromagnetic metals and alloys have been known and observed for many years. The magnetoresistance defined as $\Delta R/R$ is about 2% for an AMR material such as permalloy with magnetic fields of 5–10 Oe.

More recently, M. N. Babich et al., Phys. Rev. Lett. 61, 2472 (1988), reported giant magnetoresistance (GMR) in Fe/Cr multilayers in which there are alternate thin layers of Fe and Cr and the Fe layers are antiferromagnetically coupled. While such mutilayer systems have much larger magnetoresistance effects (45%), large fields of the order of 20 kOe are needed to produce the effect. GMR is also exhibited by spin-valves. Spin-valves are layer structures which are comprised of a "pinning" antiferromagnetic layer which serves to pin the magnetization of an adjacent ferromagnetic layer to a particular orientation. A second ferromagnetic, separated from the first by a non-magnetic conductor, can be rotated with relatively low fields, i.e., 10–20 Oe.

Colossal magnetorestriction (CMR) with $\Delta R/R(H)$ of 100,000% or more has been observed (see S. Jin et al., Science 264, 413 (1994)) in lanthanum manganese films having perovskite structure with magnetic fields of 6 T.

CMR effects have been observed in $Tl_2Mn_2O_7$ which has a pyrochlore structure (see Y. Shimakawa et al., Nature 379, 53 (1996), and in $Tl_{2-x}In_xMn_2O_7$. (see S-W. Cheong et al., Solid State Comm. 98, 163 (1996)). Greedan et al., Solid State Comm. 99, 399 (1996) report that the pyrochlore $Sc_2Mn_2O_7$ is an insulator.

Magnetic read heads using AMR are in use commercially. They provide increased sensitivity over conventional thin film inductive heads. GMR and CMR provide the potential for even greater head sensitivity and CMR materials suitable for this use are needed. The present invention suits these needs and otherwise overcomes certain deficiencies of the prior art. Other objects and advantages will become apparent to those skilled in the art upon reference to the attached drawings and to the detailed description of the invention which hereinafter follows.

SUMMARY OF THE INVENTION

This invention provides pyrochlore-structure compounds of the formula $Tl_{2-x}Sc_xMn_2O_7$ where x is from about 0.03 to about 0.45, preferably from about 0.1 to about 0.4. These compounds have increased magnetoresistance compared to the unsubstituted, i.e., x=0, compound. Largest increases in magneto-resistance are 60 times that observed for the unsubstituted compound and are observed for x from about 0.2 to about 0.3. The resistivity in the temperature range above the ferromagnetic Curie temperature ($T_c$) increases by 6 orders of magnitude as x increases from 0 to 0.4. The scandium-substituted compounds of this invention provide enhanced magnetoresistance as well as a choice of resistivity.

BRIEF DESCRIPTION OF THE DRAWINGS

FIG. 2 is a plot of the magnetoresistance $\Delta R/R(6)$ as a function of temperature for various scandium-substituted compounds of the invention and for the unsubstituted compound of the prior art.

DETAILED DESCRIPTION OF THE PREFERRED EMBODIMENTS

Figure 1:
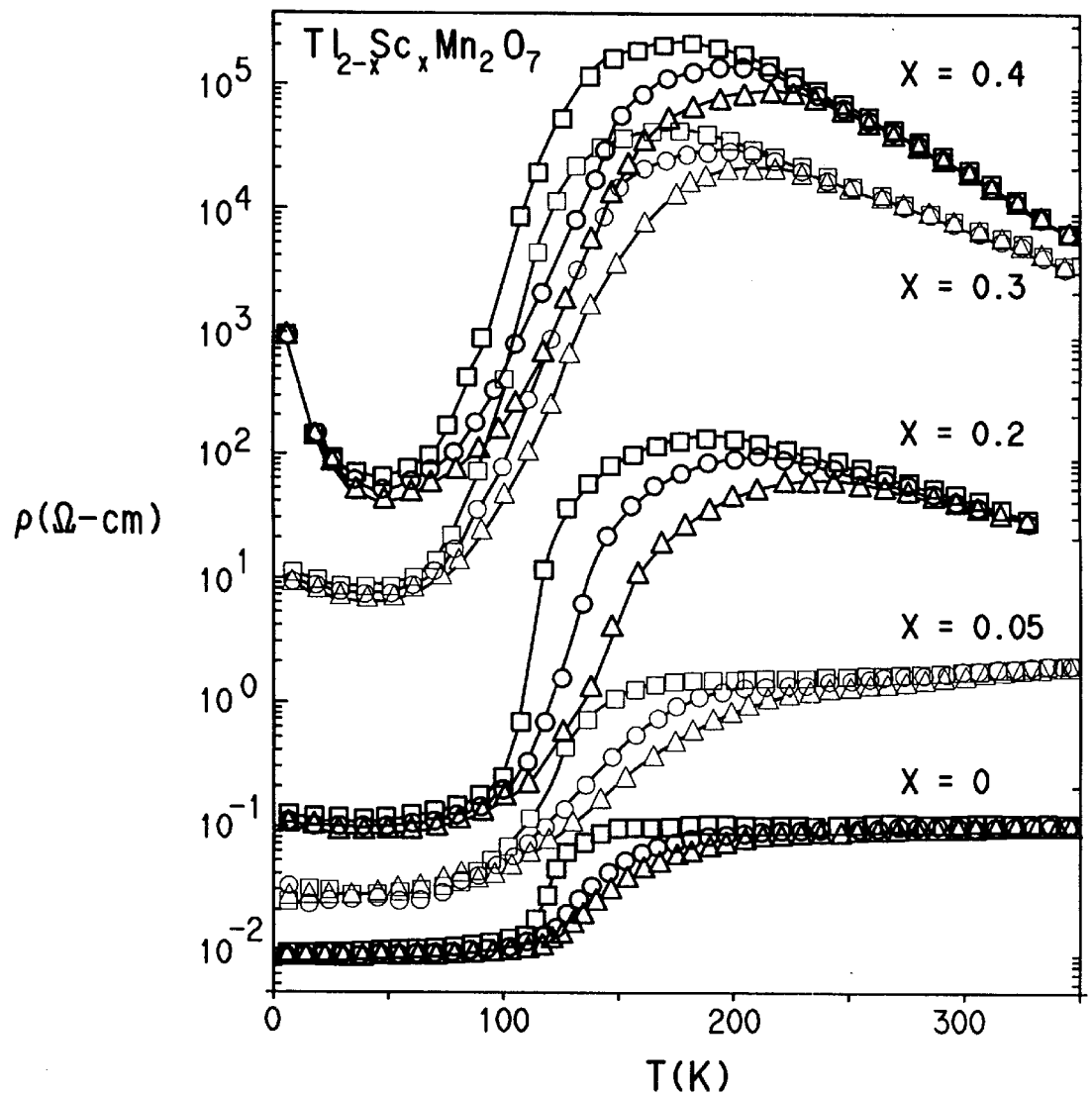
FIG. 1 is a plot of the resistivity as a function of temperature for various scandium-substituted compounds of the invention and for the unsubstituted compound of the prior art.

The invention provides scandium-substituted pyrochlore-structure compounds of the formula $Tl_2Sc_xMn_2O_7$ where x is from about 0.03 to about 0.45. These compounds can be used in magnetic read heads and provide the advantage of increased magnetoresistance with the choice of resistivity range. These materials can also be used in actuators and sensors.

These compounds can be prepared by mixing stoichiometric quantities of the precursors, e.g., the oxides of thallium, scandium and manganese, and heating them in a sealed gold capsule at an elevated pressure. While the pressure and temperature and time of heating can be varied somewhat, it was found that heating the capsule containing the mixed oxides to a temperature of 900° C. and maintaining that temperature for 30 minutes at 58 kbar ($5.8 \times 10^9$ Pa) resulted in single-phase products as determined by powder X-ray diffraction. The scandium-substituted compounds of the invention can be indexed with a cubic unit cell, space group Fd3m. The refined lattice parameters show a systematic decrease with increasing scandium substitution which is consistent with the significantly smaller octahedral ionic radius for $Sc^{3+}$ when compared with $Tl^{3+}$. For samples with $x \geq 0.5$, the X-ray diffraction patterns showed peak splitting, especially at higher 2-theta values, indicating that those samples were two-phase.

For the scandium-substituted compounds of this invention, the resistivity in the temperature range above the ferromagnetic Curie temperature ($T_c$) increases by 6 orders of magnitude as x increases from 0 to 0.4. This is in sharp contrast to the results found by S-W. Cheong et al., Solid State Comm. 98, 163 (1996), for the case of indium substitution in $Tl_{2-x}In_xMn_2O_7$ where the resistivity at 300 K for x=0.25 is only 3 times larger than that for x=0 and that for x=0.5 is only 40 times larger than that for x=0.

The measure of magnetoresistance used herein is the 6-Tesla magnetoresistance, i.e., $MR(H)=[R(0)-R(H)]/R(H)$ at H=6 Tesla, where R(0) is the resistance with zero applied magnetic field and R(H) is the resistance with an applied magnetic field of strength H. Defining $\Delta R=R(0)-R(H)$, then $MR(H)=\Delta R/R(H)$. For the scandium-substituted compounds of this invention, the MR(6) increases nearly two orders of magnitude between x=0 and x=0.3. Similar enhancements in MR(H) are found in the Mn-O perovskites where such enhancements are always accompanied by strong suppression of $T_c$. However, for the scandium-substituted pyrochlores of this invention, the suppression of $T_c$ accompanying the rise in MR(H) is much smaller.

EXAMPLES

The following non-limiting examples of the invention and comparative experiments are intended to further describe and enable the invention.

Examples 1–5 and Comparison Experiment A

Compounds of the formula $Tl_{2-x}Sc_xMn_2O_7$ where x=0.05, 0.1, 0.2, 0.3 and 0.4 were the samples of Examples 1–5, respectively, and that for x=0, the sample of Comparison Experiment A. These compounds were prepared by the following procedure. For each Example and the Comparison Experiment, the stoichiometric amounts of $Tl_2O_3$, $Sc_2O_3$ and MnO2 shown in Table I were mixed in an agate mortar and sealed in a gold capsule. The capsule was heated to 900° C. under a pressure of 58 kbar ($5.8 \times 10^9$ Pa) in a tetrahedral anvil and maintained at that temperature for 30 minutes and then rapidly cooled to room temperature (about 20° C.) before lowering the pressure. The $Tl_{2-x}Sc_xMn_2O_7$ product was recovered from the capsule. Powder X-ray diffraction patterns were obtained for each of the Examples and Comparison Experiment A. All observed peaks can be indexed with a cubic unit cell, space group Fd3m and no additional reflections due to impurities are observed. Electron microprobe analysis of each sample showed that each compound is stoichiometric and that the composition agrees well with the composition of the starting precursor oxide composition (±1%).

The resistivity $\rho$ was measured using a standard 4-probe in-line technique. FIG. 1 is a plot of the resistivity versus temperature, $\rho(T)$, for the samples of Examples 1, 3, 4 and 5 and Comparison Experiment A.

The magnetoresistance MR(6)=[R(0)—R(6)]/R(6) was measured for each of the samples Examples 1–5 and Comparison Experiment A and the results are shown in FIG. 2.

TABLE 1

| Example-Comp. Ex. | X | $Tl_2O_3$ | $Sc_2O_3$ (g) | $MnO_2$ (g) | Unit cell parameter a (nm) |
|---|---|---|---|---|---|
| A | 0 | 2.2837 | 0 | 0.8694 | 0.9892 |
| 1 | 0.05 | 2.2266 | 0.0173 | 0.8694 | 0.9888 |
| 2 | 0.1 | 2.1695 | 0.0345 | 0.8694 | 0.9881 |
| 3 | 0.2 | 2.0553 | 0.0690 | 0.8694 | 0.9868 |
| 4 | 0.3 | 1.9411 | 0.1034 | 0.8694 | 0.9855 |
| 5 | 0.4 | 1.8270 | 0.1379 | 0.8694 | 0.9845 |

Although particular embodiments of the present invention have been described in the foregoing description, it will be understood by those skilled in the art that the invention is capable of numerous modifications, substitutions and rearrangements without departing from the spirit or essential attributes of the invention. Reference should be made to the appended claims, rather than to the foregoing specification, as indicating the scope of the invention.

I claim:

1. A pyrochlore-structure compound of the formula $Tl_{2-x}Sc_xMn2O_7$, wherein x is from about 0.03 to about 0.45.

2. The pyrochlore-structure compound of claim 1, wherein x is from about 0.1 to about 0.4.

3. The pyrochlore-structure compound of claim 2, wherein x is from about 0.2 to about 0.3.

4. A magnetic read head having a magnetoresistive material comprised of a pyrochlore-structure compound of the formula $Tl_{2-x}Sc_xMn_2O_7$, wherein x is from about 0.03 to about 0.45.

5. The magnetic read head of claim 4, wherein x is from about 0.1 to about 0.4.

6. The magnetic read head of claim 5, wherein x is from about 0.2 to about 0.3.

* * * * *